US008980743B2

(12) United States Patent
Burgess et al.

(10) Patent No.: US 8,980,743 B2
(45) Date of Patent: Mar. 17, 2015

(54) METHOD FOR APPLYING A FINAL METAL LAYER FOR WAFER LEVEL PACKAGING AND ASSOCIATED DEVICE

(71) Applicant: FlipChip International, LLC, Phoenix, AZ (US)

(72) Inventors: Guy F. Burgess, Gilbert, AZ (US); Shannon D. Buzard, Chandler, AZ (US); Anthony P. Curtis, Queen Creek, AZ (US); Douglas M. Scott, Phoenix, AZ (US)

(73) Assignee: FlipChip International LLC, Phoenix, AZ (US)

( * ) Notice: Subject to any disclaimer, the term of this patent is extended or adjusted under 35 U.S.C. 154(b) by 0 days.

(21) Appl. No.: 13/789,411

(22) Filed: Mar. 7, 2013

(65) Prior Publication Data
US 2013/0328203 A1 Dec. 12, 2013

Related U.S. Application Data

(60) Provisional application No. 61/658,788, filed on Jun. 12, 2012.

(51) Int. Cl.
H01L 21/44 (2006.01)
H01L 23/485 (2006.01)
H01L 21/768 (2006.01)
H01L 23/482 (2006.01)
H01L 23/36 (2006.01)
H01L 23/373 (2006.01)

(52) U.S. Cl.
CPC .......... *H01L 23/485* (2013.01); *H01L 21/7685* (2013.01); *H01L 23/3736* (2013.01); *H01L 23/4827* (2013.01); *H01L 2224/16238* (2013.01); *H01L 2224/13099* (2013.01); *H01L 23/36* (2013.01)
USPC ............ 438/656; 438/648; 438/612; 438/613

(58) Field of Classification Search
CPC ... H01L 23/485; H01L 21/44; H01L 21/7685; H01L 23/532
USPC .......... 257/763, 761, 762, E21.476, E21.477, 257/E21.582, E23.157; 438/656, 113, 612, 438/648, 613
See application file for complete search history.

(56) References Cited

U.S. PATENT DOCUMENTS 4,790,922 A * 12/1988 Huffer .................... 204/192.27
4,793,041 A * 12/1988 Jenkins et al. ................. 492/37
7,271,072 B2 * 9/2007 Graettinger .................. 438/396
(Continued)

FOREIGN PATENT DOCUMENTS

WO 2010075998 A2 7/2010

OTHER PUBLICATIONS

KIPO Search Report and Written Opinion dated Sep. 13, 2013 for corresponding Application No. PCT/US2013/043943.

*Primary Examiner* — Thien F Tran
(74) *Attorney, Agent, or Firm* — Arno T. Naeckel

(57) ABSTRACT

A wafer level semiconductor device and manufacturing method including providing a semiconductor device wafer substrate having a backside, applying to the backside a conductive metallization layer, and applying to the backside over the conductive metallization layer a protective metal layer of titanium, titanium alloys, nickel, nickel alloys, chromium, chromium alloys, cobalt. cobalt alloys, palladium, and palladium alloys.

14 Claims, 2 Drawing Sheets

(56) References Cited

U.S. PATENT DOCUMENTS

| | | |
|---|---|---|
| 7,842,543 B2 * | 11/2010 | Wu et al. .................. 438/106 |
| 2002/0179913 A1 | 12/2002 | Shirakawa |
| 2004/0166661 A1 * | 8/2004 | Lei ............................. 438/614 |
| 2008/0166837 A1 * | 7/2008 | Feng et al. ................. 438/113 |
| 2008/0210567 A1 | 9/2008 | Karuppuchamy et al. |
| 2010/0247883 A1 | 9/2010 | Gong et al. |

* cited by examiner

METHOD FOR APPLYING A FINAL METAL LAYER FOR WAFER LEVEL PACKAGING AND ASSOCIATED DEVICE

CROSS REFERENCE TO RELATED APPLICATIONS

This application claims the benefit of priority of U.S. Provisional Patent Application Ser. No. 61/658,788, filed Jun. 12, 2012, entitled Method For Applying A Corrosion Resistant Final Metal Layer Atop Previous Backside Metal Layer(s) For Wafer Level Packaging, the disclosure of which is hereby incorporated by reference in its entirety.

FIELD

The present disclosure generally relates to a structure and method for semiconductor devices, and more particularly to a structure and method for electronic wafer-level chip-scale packaging and flip-chip packaging and assembly.

BACKGROUND

Backside metallization depositions/coatings can be applied to the semiconductor chips or other microelectronic devices via sputtering, evaporation, electroplating, electroless plating etc. which are deposition technologies that are known to those familiar with the art. There are a variety of reasons metallizations are placed on the backside of the semiconductor substrate in the semiconductor industry. They can be used on integrated circuits to help dissipate heat build-up during operation of the device. They can also be used to modify the electrical properties of the semiconductor substrate. They can also be used to increase the mechanical strength or reliability of a thinned substrate following a backgrind process.

Backside metallization layer(s) are generally placed on the backside of thinly ground or full thickness chips/devices while the chips/devices are still in wafer form.

Backside metallization requires suitable adhesion between the semiconductor substrate material and the initial backside metallization layer. Subsequent metal layers can then be applied dependent on the intended application provided the added metal depositions/coatings have a suitable level of adhesion between layers for long term reliability.

Copper and its alloys are highly used backside metallization layers due to their high electrical conductivity and thermal heat transfer. However, Cu and its alloys can become corroded or oxidized in subsequent processing steps, during assembly, and/or when subjected to high humidity environments.

A corroded or oxidized backside metal surface presents a variety of problems which could include but are not limited to: a discolored backside surface that will interfere with automated assembly vision requirements (especially if a laser marking is present), increased risk of extended corrosion shortening the life of the part, increased risk of extended corrosion inhibiting the overall performance of the device.

One known solution is to apply an outer corrosion resistant metallization layer of gold, platinum, silver, platinum or palladium. However, the cost of each of these metals is prohibitively high. Therefore a more cost-effective solution is needed.

SUMMARY OF THE DISCLOSURE

This disclosure provides a cost effective corrosion/oxidation resistant backside protective metal layer atop any layer of Copper and its alloys and any other previously applied backside metal layer that is susceptible to the problems described above. This will thereby provide a surface that is chemically and mechanically viable through subsequent processing steps, assembly, and throughout the life of the assembled part.

A reliable and manufacturable method for applying a corrosion and oxidation resistant metal layer atop previously applied backside metal layer(s) for thinned and full thickness semiconductor substrates has been invented. The deposition of this metal layer can be accomplished through sputtering, evaporation, immersion plating, electroless plating, or other deposition/coating techniques.

The method in accordance with this disclosure includes providing a semiconductor device such as a Wafer-Level Chip-Scale (WLCSP) device that has at least an outer backside metal layer that is susceptible to corrosion or discoloration; and applying a protective metal layer to the outer backside metal layer wherein the protective metal is selected from the group consisting of Titanium, Titanium Alloys, Nickel, Nickel Alloys, Chromium, Chromium Alloys, Cobalt, Cobalt Alloys, Tungsten, Tungsten Alloys, Palladium and Palladium Alloys.

The device in accordance with this disclosure includes a semiconductor wafer substrate having a backside, a conductive prior metallization layer on the backside, and a protective metal layer over the metallization layer, wherein the protective metal is selected from a the group consisting of Titanium, Titanium alloys, Nickel, Nickel Alloys, Chromium, Chromium alloys, Cobalt, Cobalt alloys, Tungsten, Tungsten Alloys, Palladium and Palladium alloys.

BRIEF DESCRIPTION OF THE DRAWINGS

For a more complete understanding of the present disclosure, reference is now made to the following figures.

The exemplification set out herein illustrates particular embodiments, and such exemplification is not intended to be construed as limiting in any manner.

DETAILED DESCRIPTION

One embodiment of a method in accordance with this disclosure includes providing a semiconductor device such as a Wafer-Level Chip-Scale package (WLCSP) device that has at least an outer backside metal layer that is susceptible to corrosion or discoloration; and applying a protective metal layer of titanium to the outer backside metal layer. This titanium layer may be applied by any conventional means such as vapor deposition, sputtering, and chemical plating.

The corrosion/oxidation resistant metals for this invention include: titanium and its alloys, nickel and its alloys, chromium and its alloys, and cobalt and its alloys. This disclosure provides a means for the finished surface to remain uniformly colored throughout the life of the part, even in higher humidity conditions for both non-laser mark applications, as well as laser marked surfaces.

This method applies to any semiconductor substrate with previously applied backside metallization that can be corroded, oxidized, and/or discolored and includes but is not limited to: copper and its alloys, aluminum and its alloys, silver and its alloys, tungsten and its alloys, etc. The resulting corrosion/oxidation resistant metal layer can be deposited with a range between 10 Angstroms and 40,000 Angstroms.

In one particular embodiment of this invention the underlying metal layer is a copper plated metallization that is also subsequently processed through laser marking, which produces a laser marked backside plated copper layer, followed by the deposition of a corrosion/oxidation resistant titanium layer. The resulting backside metallization is uniformly colorized for clear legibility of the laser marking and it is highly resistant to corrosion or oxidation.

Figure 1:
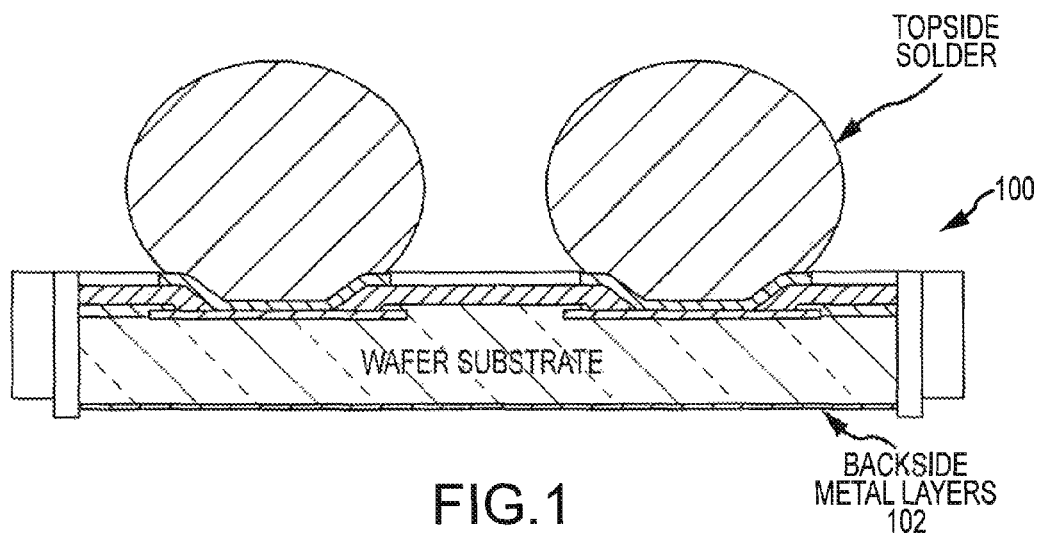
FIG. 1 illustrates a cross-sectional view of a portion of a semiconductor wafer substrate with I/O bond pads. This view also shows the deposited backside metal layers.
Figure 2:
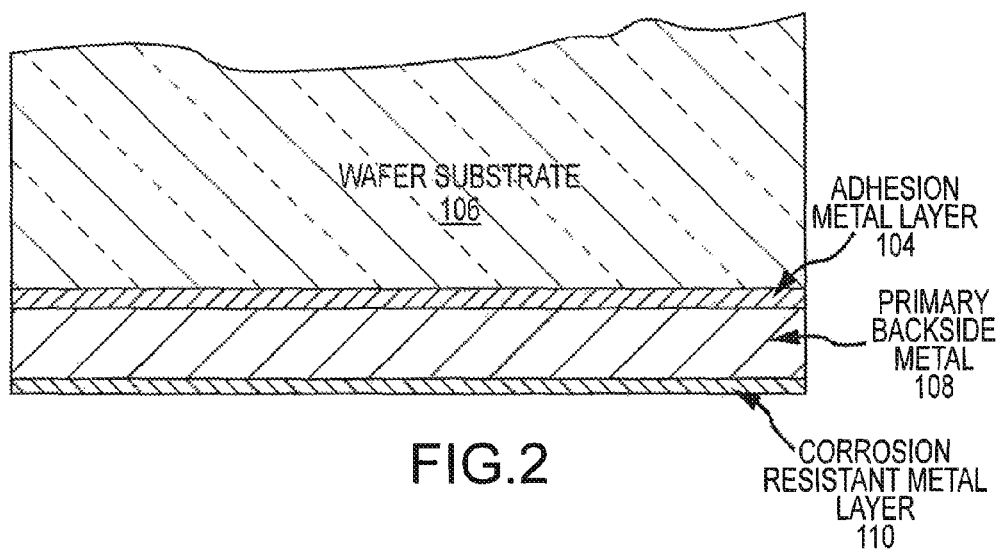
FIG. 2 illustrates a closer cross-sectional view of the semiconductor wafer substrate and the backside metal layers.
Figure 3:
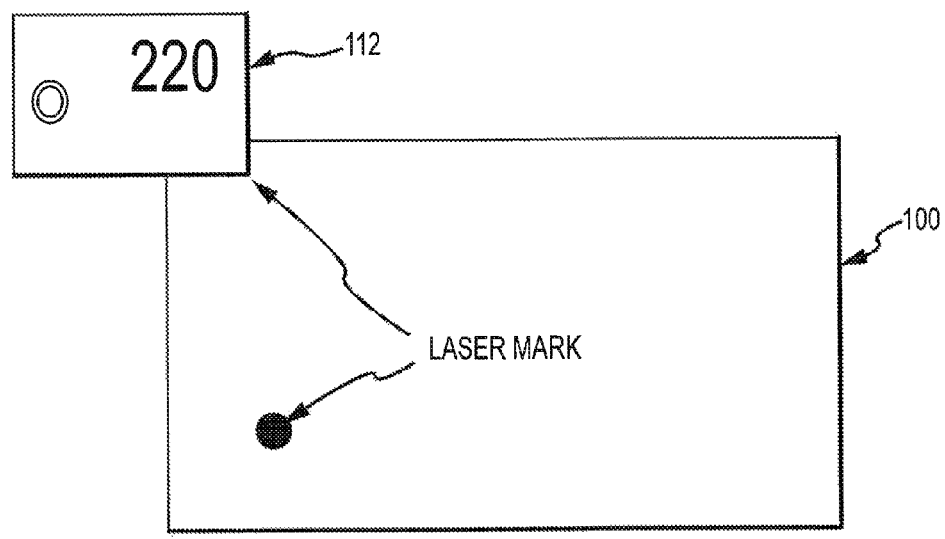
FIG. 3 illustrates a backside view of the semiconductor substrate with backside metallization and with a laser marking.

FIG. 1 shows a cross sectional view of an assembled WLCSP device substrate 100 that includes one or more backside metal layers 102. FIG. 2 is an enlarged view of the device substrate 100 in accordance with the present disclosure showing an adhesion metal layer 104 applied first to the wafer substrate 106, followed by a primary backside metal layer 108, and finally application of a corrosion resistant metal layer 110 in accordance with the present disclosure. This outer corrosion resistant metal layer 110 may be applied either before or after laser etching of an identification mark 112 as shown in FIG. 3.

Figure 4:
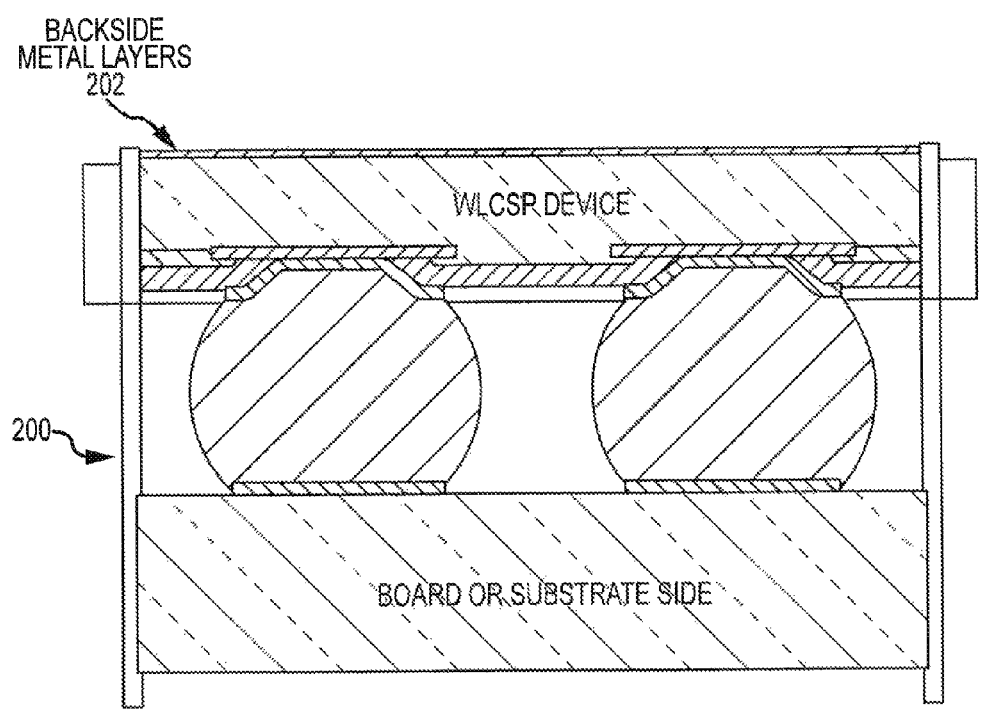
FIG. 4 illustrates the cross-sectional view of a portion of an assembled WLCSP device with backside metallization attached to a corresponding board or other board side substrate.

FIG. 4 is a cross sectional view of a completely assembled device 200 in accordance with an embodiment of the present disclosure. The backside metal layers 202 comprise at least a primary layer 108 and an outer corrosion resistant layer 110 as described above with reference to FIG. 2.

This disclosure includes a new method of using a final backside metallization layer that is corrosion/oxidation resistant atop previously deposited/coated metal layers.

This corrosion/oxidation resistant layer can be deposited through the means of sputtering, evaporation, immersion plating, electroless plating or other deposition/coating techniques.

Titanium and its alloys are an ideal metal for this final resistant backside metallization layer provided its adhesion to the previously deposited metallizaton layer is suitable for reliability.

Other corrosive/oxidation resistant metals such as nickel and its alloys, chromium and its alloys, cobalt and its alloys, Tungsten and its alloys, as well as Palladium and its alloys are also good candidates for forming this final deposited layer provided their adhesion to the previously deposited metallization layer is suitable for reliability. By using this final backside metallization layer, the backside surface of the semiconductor substrate will remain uniform in appearance through subsequent processing of the semiconductor substrate and throughout the life of the part.

This new method can be used in conjunction with or without laser marking, with the laser marking occurring either before or after the deposition of this final protective metallization layer. Preferably the method involves using a final backside metallization layer that is corrosion/oxidation resistant atop a previously deposited copper or one of its alloys as the prior metallization layers. In particular, the final metallization layer is comprised of titanium atop a previously electroplated copper or one of its alloys as the prior metallization layer.

One specific embodiment of this invention includes deposition of copper or one of its alloys as a first backside metallization, producing a laser marking on the first backside metallization layer, followed by deposition of an additional metallization layer of titanium atop the previously deposited copper backside metallization or one of its alloys. An alternate embodiment of this invention includes deposition of copper or one of its alloys as a first backside metallization, followed by deposition of an additional metallization layer of titanium atop a previously deposited copper or one of its alloys, and finally creation of a laser marking on the previously deposited layer. Preferably there is also a liquid etch step after the laser marking to remove any copper oxide before deposition of the corrosion resistant metallization layer of titanium. Furthermore, additional metallization layers may be applied beyond the two layers above specifically described, Preferably the corrosion/oxidation resistant layer can be deposited in a range between 10 Angstroms and 40,000 Angstroms.

Although it is known that backside metallization layers have incorporated gold, silver, platinum, palladium, and nickel as a final deposited layer in a stack of metals, the specific benefit of this new method is that it can be applied later, such as after multiple steps of sputtering/plating processes or sputter/plating/laser marking processes, etc. In addition, it can preferably be applied after the laser marking process.

Many variations will become apparent to a person of ordinary skill in the art from a reading of this disclosure. For example, additional metallization layers may be applied to the backside without departing from the scope of the present disclosure. All such modifications and variations are encompassed within the scope of the present disclosure. The examples cited here are to be regarded in an illustrative rather than a restrictive sense.

The invention claimed is:

1. A method comprising:
   providing a semiconductor device wafer substrate having a backside;
   applying a primary metal layer to the backside;
   laser marking the primary metal layer; and
   applying over the laser marked primary metal layer a corrosion resistant metal layer, wherein the corrosion resistant metal layer is selected from the group consisting of titanium, titanium alloys, nickel, nickel alloys, chromium, chromium alloys, cobalt, cobalt alloys, tungsten, tungsten alloys, palladium and palladium alloys.

2. The method of claim 1 wherein the primary metal layer is one of copper and a copper alloy.

3. The method of claim 1 wherein the metal layer has a thickness between about 10 Angstroms and about 40,000 Angstroms.

4. The method of claim 1 wherein the primary metal layer is comprised of a metal susceptible to corrosion.

5. The method of claim 1 wherein the primary metal layer is comprised of one or more deposited metal layers with a surface metal layer being a metal susceptible to corrosion.

6. A method comprising:
   providing a semiconductor device wafer substrate having a backside;
   applying an adhesion metal layer to the backside;
   applying to the backside a primary metal layer;
   laser marking the primary metal layer; and
   applying to the backside, over the laser marked primary metal layer a corrosion resistant metal layer, wherein the corrosion resistant metal is selected from the group consisting of titanium, titanium alloys, nickel, nickel alloys, chromium, chromium alloys, cobalt, cobalt alloys, palladium and palladium alloys.

7. The method of claim 6 wherein the corrosion resistant metal layer has a thickness between about 10 Angstroms and about 40,000 Angstroms.

8. The method of claim 6 wherein the primary metal layer is comprised of one or more deposited metal layers.

9. The method of claim 8 wherein the primary metal layer is a metal chosen from a group consisting of aluminum and its alloys, silver and its alloys, and tungsten and its alloys.

10. The method of claim 6 wherein the primary metal layer is one of copper and a copper alloy.

11. The method of claim 6 wherein the adhesion metal layer is deposited and comprises a metal selected to adhere to the wafer substrate.

12. A method comprising:
    providing a semiconductor device wafer substrate having a backside;
    applying to the backside a primary metal layer and a corrosion resistant metal layer, wherein the corrosion resistant metal is selected from a group consisting of titanium, titanium alloys, nickel, nickel alloys, chromium, chromium alloys, cobalt, cobalt alloys, tungsten, tungsten alloys, palladium and palladium alloys; and
    laser marking the backside of the semiconductor wafer substrate after applying the corrosion resistant metal layer.

13. The method of claim 12 wherein the corrosion resistant metal layer has a thickness between about 10 Angstroms and about 40,000 Angstroms.

14. The method of claim 12 wherein the corrosion resistant metal is titanium.

* * * * *